United States Patent
Dinh et al.

(10) Patent No.: US 10,645,811 B2
(45) Date of Patent: May 5, 2020

(54) INDUCTIVE DEVICES WITH SPLITS AND METHODS OF MAKING AND USING THE SAME

(71) Applicant: Pulse Electronics, Inc., San Diego, CA (US)

(72) Inventors: Thuyen Dinh, San Diego, CA (US); Mohammad Saboori, San Diego, CA (US); Aurelio Gutierrez, Bonita, CA (US); Thomas Rascon, Temecula, CA (US)

(73) Assignee: PULSE ELECTRONICS, INC., San Diego, CA (US)

( * ) Notice: Subject to any disclaimer, the term of this patent is extended or adjusted under 35 U.S.C. 154(b) by 0 days.

(21) Appl. No.: 15/199,407

(22) Filed: Jun. 30, 2016

(65) Prior Publication Data
US 2017/0004919 A1    Jan. 5, 2017

Related U.S. Application Data

(60) Provisional application No. 62/188,400, filed on Jul. 2, 2015.

(51) Int. Cl.
*H05K 1/18* (2006.01)
*H01F 17/04* (2006.01)
(Continued)

(52) U.S. Cl.
CPC .......... *H05K 1/18* (2013.01); *H01F 27/2823* (2013.01); *H01F 27/2828* (2013.01);
(Continued)

(58) Field of Classification Search
CPC ...... H01F 17/045; H01F 27/2823; H05K 1/18
See application file for complete search history.

(56) References Cited

U.S. PATENT DOCUMENTS 2,462,651 A * 2/1949 Lord .................. H01F 27/2823
                                                                                336/183
3,197,723 A    7/1965 Dortort
(Continued)

FOREIGN PATENT DOCUMENTS

JP    2006339250 A    12/2006
JP    2014120730 A    6/2014
(Continued)

OTHER PUBLICATIONS

Norbert Peters, Technologies & Products Press Conference, World's Smallest Common-mode Chokes for Automotive Ethernet, Nov. 7, 2013, 11 pages.
(Continued)

*Primary Examiner* — Elvin G Enad
*Assistant Examiner* — Malcolm Barnes
(74) *Attorney, Agent, or Firm* — Gazdzinski & Associates, PC

(57) ABSTRACT

Methods and apparatus for providing enhanced coupled inductive devices. In one embodiment, an inductive device is disclosed that is suitable in Ethernet applications with data speeds exceeding one (1) Gbps. Specifically, the inductive devices described herein possess a high level of magnetic and capacitive coupling between the wires of the windings. Moreover, the inductive devices described herein are suitable for automated processes, thereby reducing the overall costs associated with their manufacture and use. Furthermore, methods for manufacturing and using these aforementioned inductive devices are also disclosed. For example, the aforementioned inductive devices may readily be incorporated into ICMs thereby replacing, in their entirety or in part, manually wound toroidal transformers.

16 Claims, 7 Drawing Sheets

(51) Int. Cl.
    *H01F 27/28*     (2006.01)
    *H01F 27/30*     (2006.01)
    *H01F 41/10*     (2006.01)
    *H01F 27/29*     (2006.01)

(52) U.S. Cl.
    CPC .......... *H01F 27/292* (2013.01); *H01F 27/306* (2013.01); *H01F 41/10* (2013.01)

(56) References Cited

U.S. PATENT DOCUMENTS

| | | | |
|---|---|---|---|
| 3,299,385 A | 1/1967 | Stein et al. | |
| 3,348,182 A | 10/1967 | Baker et al. | |
| 3,359,518 A | 12/1967 | Stein | |
| 3,766,504 A | 10/1973 | Yannucci et al. | |
| 4,473,811 A | 9/1984 | Schauble | |
| 6,373,366 B1 | 4/2002 | Sato et al. | |
| 8,093,980 B2 | 1/2012 | Asou et al. | |
| 8,405,481 B2 | 3/2013 | Renteria | |
| 8,686,822 B2 | 4/2014 | Huang et al. | |
| 2003/0071704 A1 | 4/2003 | Toi et al. | |
| 2006/0009061 A1* | 1/2006 | Machado | H01R 13/514 439/215 |
| 2006/0267719 A1 | 11/2006 | Yasuda et al. | |
| 2008/0308662 A1* | 12/2008 | Yang | H01F 27/2823 242/160.1 |
| 2008/0309445 A1* | 12/2008 | Suzuki | H01F 27/2823 336/183 |
| 2009/0045902 A1 | 2/2009 | Hirai | |
| 2009/0219127 A1* | 9/2009 | Tomonari | H01F 19/04 336/192 |
| 2010/0109827 A1* | 5/2010 | Asou | H01F 17/045 336/192 |
| 2012/0058676 A1* | 3/2012 | Schaffer | H01F 5/003 439/620.21 |
| 2012/0309233 A1* | 12/2012 | O'Malley | H01R 13/6469 439/626 |
| 2013/0049914 A1* | 2/2013 | Huang | H01F 27/292 336/192 |
| 2013/0323974 A1* | 12/2013 | Gutierrez | H01F 5/003 439/620.15 |
| 2014/0097928 A1* | 4/2014 | Tomonari | H01F 27/28 336/207 |
| 2014/0154920 A1 | 6/2014 | Dinh et al. | |
| 2014/0167903 A1* | 6/2014 | Tomonari | H01F 17/045 336/220 |
| 2014/0292463 A1* | 10/2014 | Lai | H01F 27/29 336/192 |
| 2014/0292465 A1* | 10/2014 | Takagi | H01F 27/292 336/192 |
| 2014/0306789 A1 | 10/2014 | Hirai et al. | |
| 2015/0287520 A1* | 10/2015 | Takagi | H01F 27/29 336/170 |
| 2016/0155561 A1* | 6/2016 | Takagi | H01F 27/2823 336/222 |

FOREIGN PATENT DOCUMENTS

| | | |
|---|---|---|
| JP | 2014199904 A | 10/2014 |
| JP | 2015165592 A | 9/2015 |

OTHER PUBLICATIONS

TDK, Common Mode Filters for Automobile Signal Line, ACT Series, Nov. 2013, 11 pages.

* cited by examiner

INDUCTIVE DEVICES WITH SPLITS AND METHODS OF MAKING AND USING THE SAME

PRIORITY

This application claims the benefit of priority to U.S. Provisional Patent Application Ser. No. 62/188,400 of the same title filed Jul. 2, 2015, which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. TECHNOLOGICAL FIELD

The present disclosure relates generally to the area of electronic components and assemblies, and more specifically in one exemplary aspect to an improved design for providing a surface mountable inductive device, and methods of manufacturing and using the same.

2. DESCRIPTION OF RELATED TECHNOLOGY

Traditionally, inductive devices such as e.g., transformers that have been used in, for example, Ethernet and other data-related applications. Transformers may be manufactured by, for example, manually or automatically winding magnet wires on a toroidal ferrous core. One exemplary apparatus for the automated winding of these toroidal cores is described in co-owned U.S. Pat. No. 3,985,310 to Kent, et al. the contents of which are incorporated herein by reference in its entirety. However, in practice, toroidal cores are often wound manually, whether entirely by hand, or a combination of a manual operator and a winding machine, for a variety of reasons including cost efficiency and consistency. Moreover, securing the termination wires from these wound toroidal cores has always been done manually, as it has been difficult for automated processing equipment to easily identify the different wires for routing to different termination points.

More recently, wide-band transformers, such as those used in Ethernet applications that support data speeds in excess of one Gigabit per second (Gbps), require a high level of magnetic coupling between the windings that make up the transformer. Wires in these so-called Gigabit Ethernet transformers are typically twisted together in order to attain the requisite degree of magnetic and capacitive coupling. Although equipment for the automated winding of twisted wire windings have been available in the prior art, these transformers wound by such automated machinery still necessitate manual-intensive processes in order to sort and terminate these wires to their proper termination points in their end applications. This problem is further exacerbated in transformer applications which require center tap connections in order to properly function.

Moreover, the downward pressure on pricing for these magnetic components often makes manually wound transformers unsuitable in more cost-sensitive end applications such as in integrated connector modules (ICMs). Accordingly, there remains an unsatisfied need for magnetic components that can provide one or more of the following: (1) be manufactured using (at least primarily) automated processes; (2) achieve a high level of magnetic coupling between adjacent windings; and (3) incorporate one or more integrated center tap connections, all while (4) forming a substantially closed magnetic path in order to reduce the harmful and deleterious effects associated with electromagnetic interference (EMI).

SUMMARY

The present disclosure satisfies the aforementioned needs by providing, inter alia, an improved inductive apparatus and methods for manufacturing and using the same.

In a first aspect, an inductive device is disclosed. In one embodiment, the inductive device includes a core that includes an axial portion, a first flange portion and a second flange portion, with the first flange portion being disposed on an opposing side of the axial portion with the second flange portion, the first flange portion that includes a first plurality of interface connections and the second flange portion that includes a second plurality of interface connections; a pair of primary windings, with each primary winding of the pair being coupled to one of the first plurality of interface connections and one of the second plurality of interface connections; and a pair of secondary windings, with each secondary winding of the pair being coupled to one of the first plurality of interface connections and one of the second plurality of interface connections.

In one variant, the inductive device further includes an end cap core portion, the end cap core portion being coupled with both the first flange portion and the second flange portion. The coupling of the end cap core portion with both the first flange portion and the second flange portion configured to provide a closed magnetic path for magnetic flux resultant from current running through the pair of primary and/or secondary windings.

In yet another variant, the first plurality of interface connections includes a first primary interface connection, a first primary center tap interface connection, a first secondary interface connection, and a first secondary center tap interface connection.

In yet another variant, the second plurality of interface connections includes a second primary interface connection, a second primary center tap interface connection, a second secondary interface connection, and a second secondary center tap interface connection.

In yet another variant, the pair of primary windings includes: a first primary winding that couples the first primary interface connection to the second primary center tap interface connection; and a second primary winding that couples the first primary center tap connection to the second primary interface connection.

In yet another variant, the pair of secondary windings includes: a first secondary winding that couples the first secondary interface connection to the second secondary center tap interface connection; and a second secondary winding that couples the first secondary center tap connection to the second secondary interface connection.

In yet another variant, the pair of primary windings and the pair of secondary windings are disposed about the axial portion of the core in a plurality of layers.

In yet another variant, the pair of primary windings are disposed in a layer proximate to the axial portion of the core and the pair of secondary windings are disposed in a second layer of the plurality of layers, the layer proximate to the axial portion residing between the axial portion of the core and the second layer of the plurality of layers.

In yet another variant, the pair of secondary windings are disposed in a layer proximate to the axial portion of the core and the pair of primary windings are disposed in a second layer of the plurality of layers, the layer proximate to the axial portion residing between the axial portion of the core and the second layer of the plurality of layers.

In yet another variant, the first primary winding is disposed in a layer proximate to the axial portion of the core and the second primary winding is disposed in a second layer of the plurality of layers, the layer proximate to the axial portion residing between the axial portion of the core and the second layer of the plurality of layers.

In yet another variant, the first secondary winding is disposed in the layer proximate to the axial portion of the core and the second secondary winding is disposed in the second layer of the plurality of layers.

In yet another variant, the pairs of primary and secondary windings are disposed upon the axial portion of the core so as to enhance magnetic and capacitive coupling between the windings.

In yet another variant, the first plurality of interface connections and the second plurality of interface connections are configured to interface with a printed circuit board via a plurality of traces, the plurality of traces includes a first trace that couples the first primary center tap interface connection with the second primary center tap interface connection.

In yet another variant, the inductive device further includes a second trace that couples the first secondary center tap interface connection with the second secondary center tap interface connection.

In a second aspect, methods of winding the aforementioned inductive device are disclosed. In one embodiment, the method includes securing a first of a pair of primary windings to a first flange portion; securing a first of a pair of secondary windings to the first flange portion; simultaneously winding the first of the pair of primary and secondary windings about an axial portion of a core in a first direction; securing the first of the pair of primary windings to a second flange portion; and securing the first of the pair of secondary windings to the second flange portion.

In one variant, the method further includes securing a second of the pair of primary windings to the second flange portion; securing a second of the pair of secondary windings to the second flange portion; and simultaneously winding the second of the pair of primary and secondary windings about the axial portion of the core in a second direction, the second direction being opposite than the first direction.

In a third aspect, sub-assemblies that utilize one or more of the aforementioned inductive device are disclosed. In one embodiment, the sub-assemblies are configured for use in a high-speed (i.e., 1 Gbps or greater) data networking application.

In another embodiment, the sub-assembly includes: a printed circuit board; and an inductive device, the inductive device includes: a core that includes an axial portion, a first flange portion and a second flange portion, with the first flange portion being disposed on an opposing side of the axial portion with the second flange portion; the first flange portion includes a first plurality of interface connections and the second flange portion includes a second plurality of interface connections; a pair of primary windings, with each primary winding of the pair being coupled to one of the first plurality of interface connections and one of the second plurality of interface connections; and a pair of secondary windings, with each secondary winding of the pair being coupled to one of the first plurality of interface connections and one of the second plurality of interface connections.

In one variant, the first plurality of interface connections includes a first center tap connection and the second plurality of interface connections includes a second center tap connection and the printed circuit board includes a first trace that runs between the first center tap connection and the second center tap connection.

In another variant, the first plurality of interface connections includes a third center tap connection and the second plurality of interface connections includes a fourth center tap connection and the printed circuit board includes a second trace that runs between the third center tap connection and the fourth center tap connection.

In yet another variant, the first and second center tap connections are for a primary winding of a transformer and the third and fourth center tap connections are for a secondary winding of the transformer.

In a fourth aspect, a connector module having one or more of the aforementioned inductive devices is disclosed. In one embodiment, the connector module includes a single-port integrated connector module (ICM) or modular jack utilizing one or more of the aforementioned inductive devices. In another embodiment, the connector module includes a multi-port ICM utilizing one or more of the aforementioned inductive device.

In a fifth aspect, methods of manufacturing the aforementioned inductive devices are disclosed. In one embodiment, the method includes obtaining a core that includes an axial portion, a first flange portion and a second flange portion, with the first flange portion being disposed on an opposing side of the axial portion with the second flange portion, the first flange portion includes a first plurality of interface connections and the second flange portion includes a second plurality of interface connections; securing a first of a pair of primary windings to the first flange portion; securing a first of a pair of secondary windings to the first flange portion; simultaneously winding the first of the pair of primary and secondary windings about the axial portion of the core in a first direction; securing the first of the pair of primary windings to the second flange portion; and securing the first of the pair of secondary windings to the second flange portion.

In one variant, the method further includes securing a second of the pair of primary windings to the second flange portion; securing a second of the pair of secondary windings to the second flange portion; and simultaneously winding the second of the pair of primary and secondary windings about the axial portion of the core in a second direction, the second direction being opposite than the first direction.

In a sixth aspect, methods of manufacturing the aforementioned sub-assemblies that utilize the aforementioned inductive devices are disclosed. In one embodiment, the method includes obtaining a core that includes an axial portion, a first flange portion and a second flange portion, with the first flange portion being disposed on an opposing side of the axial portion with the second flange portion, the first flange portion includes a first plurality of interface connections and the second flange portion includes a second plurality of interface connections; securing a first of a pair of primary windings to the first flange portion; securing a first of a pair of secondary windings to the first flange portion; simultaneously winding the first of the pair of primary and secondary windings about the axial portion of the core in a first direction; securing the first of the pair of primary windings to the second flange portion; securing the first of the pair of secondary windings to the second flange portion; and soldering the core with the primary windings and secondary windings to a printed circuit board of a subassembly.

In a seventh aspect, methods of manufacturing the aforementioned single-port ICMs are disclosed. In one embodiment, the method includes obtaining a core that includes an axial portion, a first flange portion and a second flange portion, with the first flange portion being disposed on an opposing side of the axial portion with the second flange portion, the first flange portion includes a first plurality of interface connections and the second flange portion includes a second plurality of interface connections; securing a first of a pair of primary windings to the first flange portion; securing a first of a pair of secondary windings to the first flange portion; simultaneously winding the first of the pair of primary and secondary windings about the axial portion of the core in a first direction; securing the first of the pair of primary windings to the second flange portion; securing the first of the pair of secondary windings to the second flange portion; securing the core to a printed circuit board; and inserting the printed circuit board into a housing for a single-port ICM.

In an eighth aspect, methods of manufacturing the aforementioned multi-port ICMs are disclosed. In one embodiment, the method includes obtaining a core that includes an axial portion, a first flange portion and a second flange portion, with the first flange portion being disposed on an opposing side of the axial portion with the second flange portion, the first flange portion includes a first plurality of interface connections and the second flange portion includes a second plurality of interface connections; securing a first of a pair of primary windings to the first flange portion; securing a first of a pair of secondary windings to the first flange portion; simultaneously winding the first of the pair of primary and secondary windings about the axial portion of the core in a first direction; securing the first of the pair of primary windings to the second flange portion; securing the first of the pair of secondary windings to the second flange portion; securing the core to a printed circuit board; and inserting the printed circuit board into a housing for a multi-port ICM.

In a ninth aspect, methods of using the aforementioned inductive devices are disclosed. In one embodiment, the method includes obtaining a core that includes an axial portion, a first flange portion and a second flange portion, with the first flange portion being disposed on an opposing side of the axial portion with the second flange portion, the first flange portion includes a first plurality of interface connections and the second flange portion includes a second plurality of interface connections; securing a first of a pair of primary windings to the first flange portion; securing a first of a pair of secondary windings to the first flange portion; simultaneously winding the first of the pair of primary and secondary windings about the axial portion of the core in a first direction; securing the first of the pair of primary windings to the second flange portion; securing the first of the pair of secondary windings to the second flange portion; and using the core with the primary windings and secondary windings in a high speed gigabit Ethernet application.

BRIEF DESCRIPTION OF THE DRAWINGS

The features, objectives, and advantages of the disclosure will become more apparent from the detailed description set forth below taken in conjunction with the drawings, wherein.

DETAILED DESCRIPTION

Figure 1A:
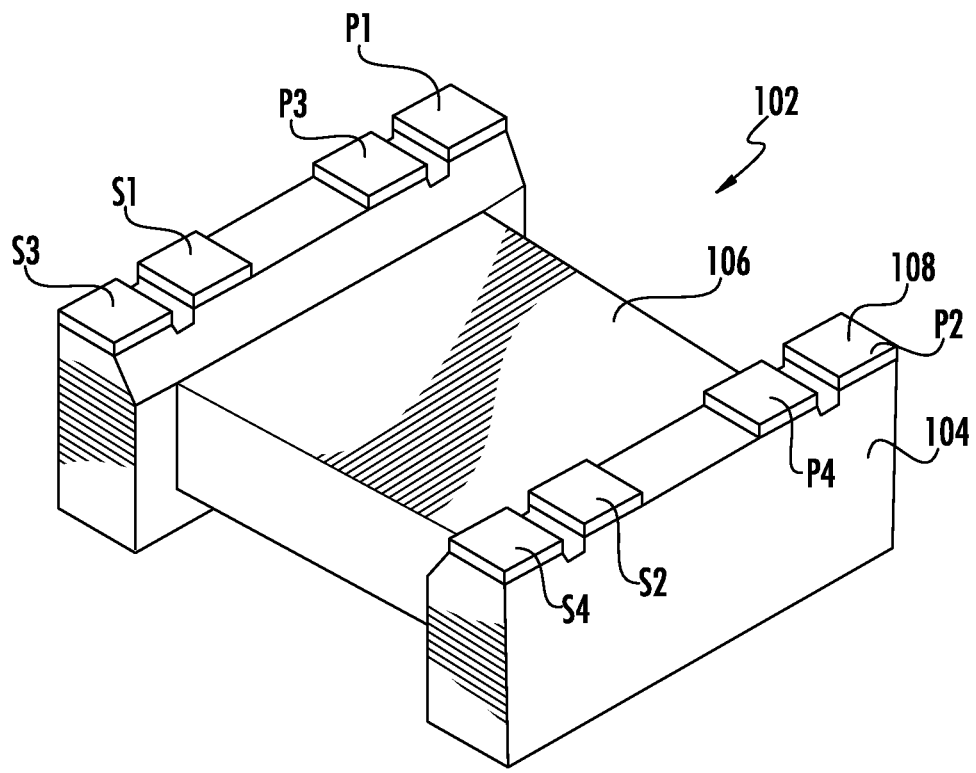
FIG. 1A is a perspective view of an exemplary embodiment of an I-shaped core in accordance with the principles of the present disclosure.

Reference is now made to the drawings, wherein like numerals refer to like parts throughout.

As used herein, the terms "electrical component" and "electronic component" are used interchangeably and refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

As used herein, the term "magnetically permeable" refers to any number of materials commonly used for forming inductive cores or similar components, including without limitation various formulations made from ferrite.

As used herein, the term "signal conditioning" or "conditioning" shall be understood to include, but not be limited to, signal voltage transformation, filtering and noise mitigation, signal splitting, impedance control and correction, current limiting, capacitance control, and time delay.

As used herein, the terms "top", "bottom", "side", "up", "down" and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

OVERVIEW

In one aspect, an improved inductive device is disclosed. In one embodiment, an inductive device is disclosed that is suitable for signal conditioning functions in Ethernet or other high-speed data applications with data speeds exceeding 1 Gbps. Specifically, exemplary embodiments of the inductive devices described herein possess a high level of magnetic and capacitive coupling between the wires of the windings. Moreover, the inductive devices described herein are suitable for automated processes, thereby reducing the overall costs associated with their manufacture and use.

Furthermore, methods for manufacturing and using these aforementioned inductive devices are also disclosed. For example, the aforementioned inductive devices, along with optionally other electrical components, may readily be incorporated into ICMs, thereby replacing (in their entirety or in part) manually wound toroidal transformers.

DETAILED DESCRIPTION OF EXEMPLARY EMBODIMENTS

It will be recognized that while the following discussion is cast in terms of an exemplary I-shaped core, it would be readily apparent to one of ordinary skill given the present disclosure that the same principles may apply to other core shapes and core assemblies. For example, it is envisioned that in certain embodiments, an inductive device and the winding techniques described herein may readily be incorporated into other shaped cores such as, for example: cylindrical rod shaped cores; "C" or "U" shaped cores; "E" shaped cores; and so-called pot-cores, etc.

Moreover, it will be recognized that while the following discussion is cast in terms of inductive devices (e.g., transformers) having four (4) discrete windings wound thereon, it would be readily apparent to one of ordinary skill given the present disclosure that more (i.e., five (5) or more) or less (i.e., three (3) or fewer) windings may be utilized in conjunction with the apparatus and methods described herein.

Finally, it will be recognized that while the following discussion is primarily cast in terms of center-tapped transformer implementations, it would be readily apparent to one of ordinary skill given the present disclosure that the same principles may apply to non-center-tapped transformers or other inductive devices such as choke coils and coupled inductors.

Exemplary Mechanical Configuration—

Figure 1B:
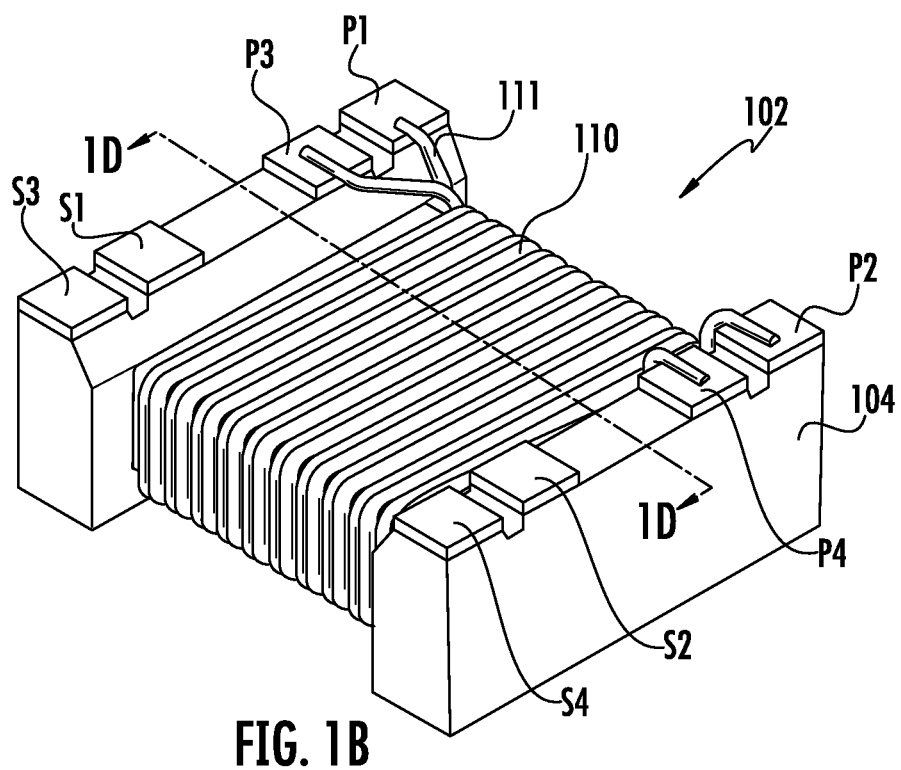
FIG. 1B is a perspective view of the exemplary I-shaped core of FIG. 1A with the primary windings wound thereon, in accordance with the principles of the present disclosure.
Figure 1C:
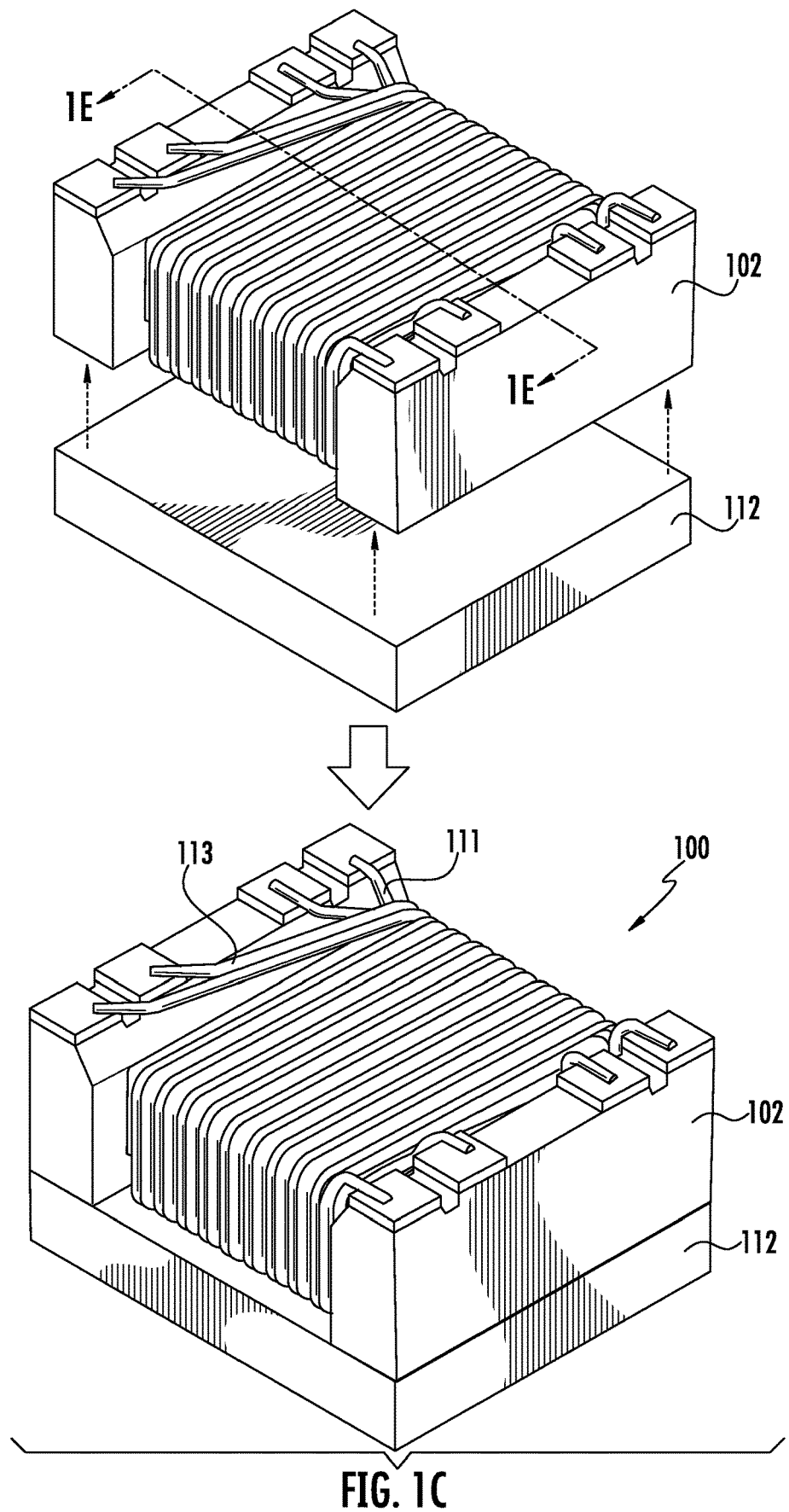
FIG. 1C is a perspective view of an exemplary inductive device with an end cap, and having primary and secondary windings disposed on the I-shaped core of FIG. 1A, in accordance with the principles of the present disclosure.

Referring now to FIGS. 1A-1C, an exemplary inductive device 100 with center tap splits in accordance with the principles of the present disclosure is illustrated and described in detail.

FIG. 1A illustrates the magnetically permeable core 102 resembling the capital letter "I" and having an axial portion 106 with flange portions 104 disposed on opposing sides of the axial portion. This underlying core configuration will hereinafter be referred to as a so-called "I-shaped core". The core 102 is shaped so as to contain the windings 110 between the flanges on the axial portion of the I-shaped core.

FIG. 1B illustrates the magnetically permeable core of FIG. 1A, with one set of windings 110 for the inductive device disposed thereon. In the illustrated embodiment of FIG. 1B, the windings 110 include a pair of primary windings 111. Moreover, in the illustrated embodiment of FIG. 1C, the windings include a pair of primary windings 111 along with a corresponding pair of secondary windings 113. However, and as discussed supra, it is readily appreciated that the number/type of windings can vary depending on the ultimate end application chosen for the underlying inductive device.

The I-shaped core 102 has many advantages over prior art toroidal cores. First, the axial portion 106 of the I-shaped core is readily accessible to automated winding equipment, thereby obviating the relatively complicated processes necessary for the automated manufacture of toroidal inductive devices. Second, because the windings 110 are contained between the flange portions 104 of the core, it is much easier to reliably position the windings in a desired (e.g., uniform) manner. The core itself is, in an exemplary embodiment, manufactured from a non-conducting ferrite material that allows for the disposition of termination pads 108 (e.g., interface connections) directly onto the core surface (e.g., on the flange portions of the core). These termination pads may then be subsequently plated using well known plating techniques. For example, the methodology described in co-owned U.S. Pat. No. 7,612,641 and entitled "Simplified Surface-Mount Devices and Methods" issued on Nov. 3, 2009, the contents of which are incorporated herein by reference in its entirety, may be readily utilized in combination with the cores described herein. These termination pads 108 are also used as input/output terminals for the inductive device in the exemplary embodiment. Accordingly, the core doesn't require any additional headers or other interface apparatus prior to its incorporation onto an end-application device, thereby minimizing component count and cost. However, it is envisioned that the incorporation of separate interface apparatus (e.g., a header having surface-mountable conductive leads, through hole conductive leads, etc.) may be desirable in certain implementations, and accordingly the exemplary devices described herein may be combined with such apparatus if desirable.

Referring again to FIG. 1C, secondary windings 113 are shown disposed on the core (the core having the primary windings 111 as shown in FIG. 1B). An end cap portion 112 is further illustrated being secured to the I-shaped core 102. In one exemplary implementation, the end cap portion is secured to the I-shaped core via the application of an epoxy onto the top surface of the flanges (i.e., the surfaces disposed opposite the surface with the termination pads). The epoxy is then subsequently cured. The incorporation of the magnetically permeable end cap portion onto the underlying I-shaped core enables a substantially closed magnetic path for the magnetic flux resultant from the primary and/or secondary windings. Hence, the underlying inductive device using the I-shaped core has many of the same EMI-related advantages associated with prior art toroidal cores.

Figure 1D:
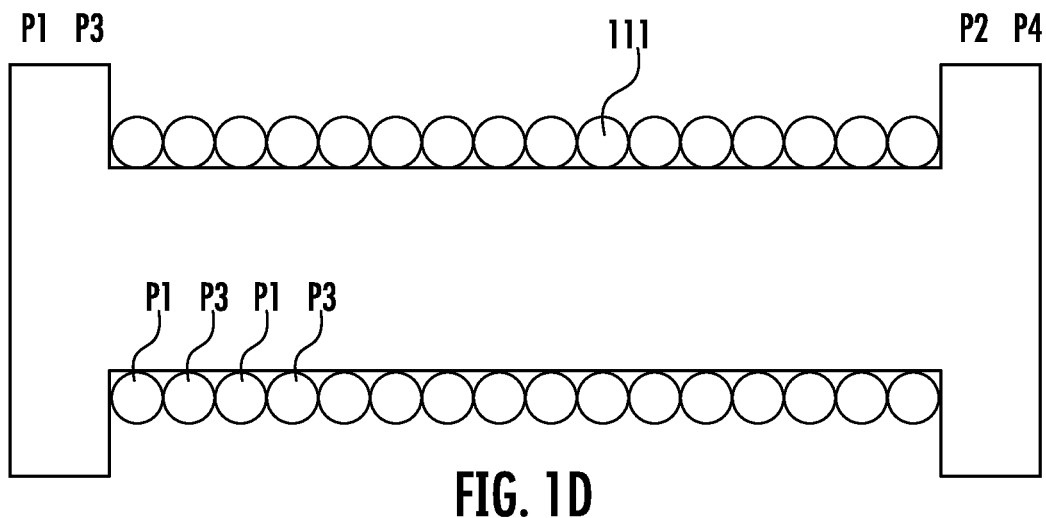
FIG. 1D is a cross-sectional view of the exemplary I-shaped core with the primary windings wound on the axial portion thereof, in accordance with the principles of the present disclosure.

Referring now to FIG. 1D, a cross-sectional view across line A-A' of the I-shaped core as shown in FIG. 1B (with only the primary windings wound on the axial portion of the core) is illustrated. Each of two primary windings (e.g., starting at termination pads P1 and P3, as will be described in the description accompanying FIG. 2A below) is seen wound in an alternating fashion between the flange portions of the core. The alternating disposition of the windings (i.e., P1, P3, P1, P3, etc.) is useful in ensuring adequate magnetic/capacitive coupling between the windings, particularly when the secondary windings are disposed on the core as is illustrated in FIG. 1E (discussed below).

Figure 1E:
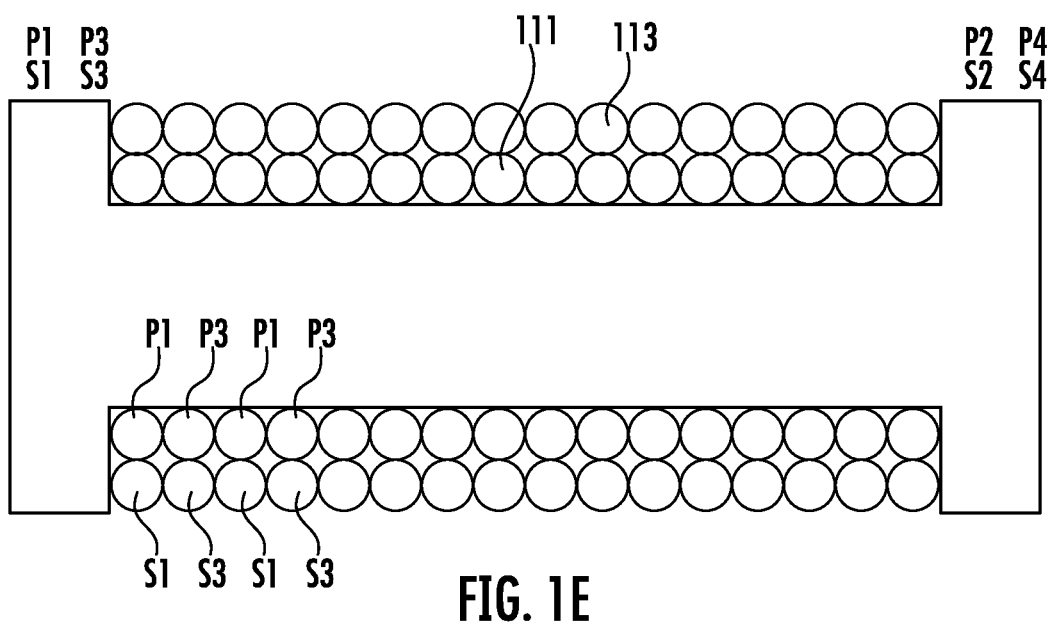
FIG. 1E is a cross-sectional view of the exemplary I-shaped core, with the primary and secondary windings wound on the axial portion thereof, in accordance with the principles of the present disclosure

FIG. 1E illustrates a cross-sectional view across line B-B' of the I-shaped core as shown in FIG. 1C, with both the primary and secondary windings wound thereon. Secondary windings are further wound directly over the primary windings in the illustrated embodiment, alternating in a similar fashion as the primary windings (e.g., starting at termination pads S1 and S3 and alternating in an S1, S3, S1, S3, etc. fashion). The alternating disposition of the secondary windings is useful in, inter alia, ensuring adequate magnetic/capacitive coupling between the windings.

It will be appreciated that various alternate winding orders are possible. For example, the first set of windings may start with P1 and S1 windings instead of P1 and P3 windings as described above, with P3 and S3 subsequently wound thereon, as will be described in further detail below. Such an alternative arrangement may have advantages in terms of e.g., direct current resistance (DCR) balance between the primary 111 and secondary windings 113. This improved DCR balance is resultant from the relatively equal length of magnetic wire between the primary and secondary windings. In other words, and referring again to FIG. 1E, the collective length of the primary windings (being wound closer to the axial portion of the I-shaped core) will be shorter in total length than the secondary windings which are wound further away from the axial portion of the I-shaped core. These and other variants will be described below with regards to FIGS. 2A and 2B.

Figure 2A:
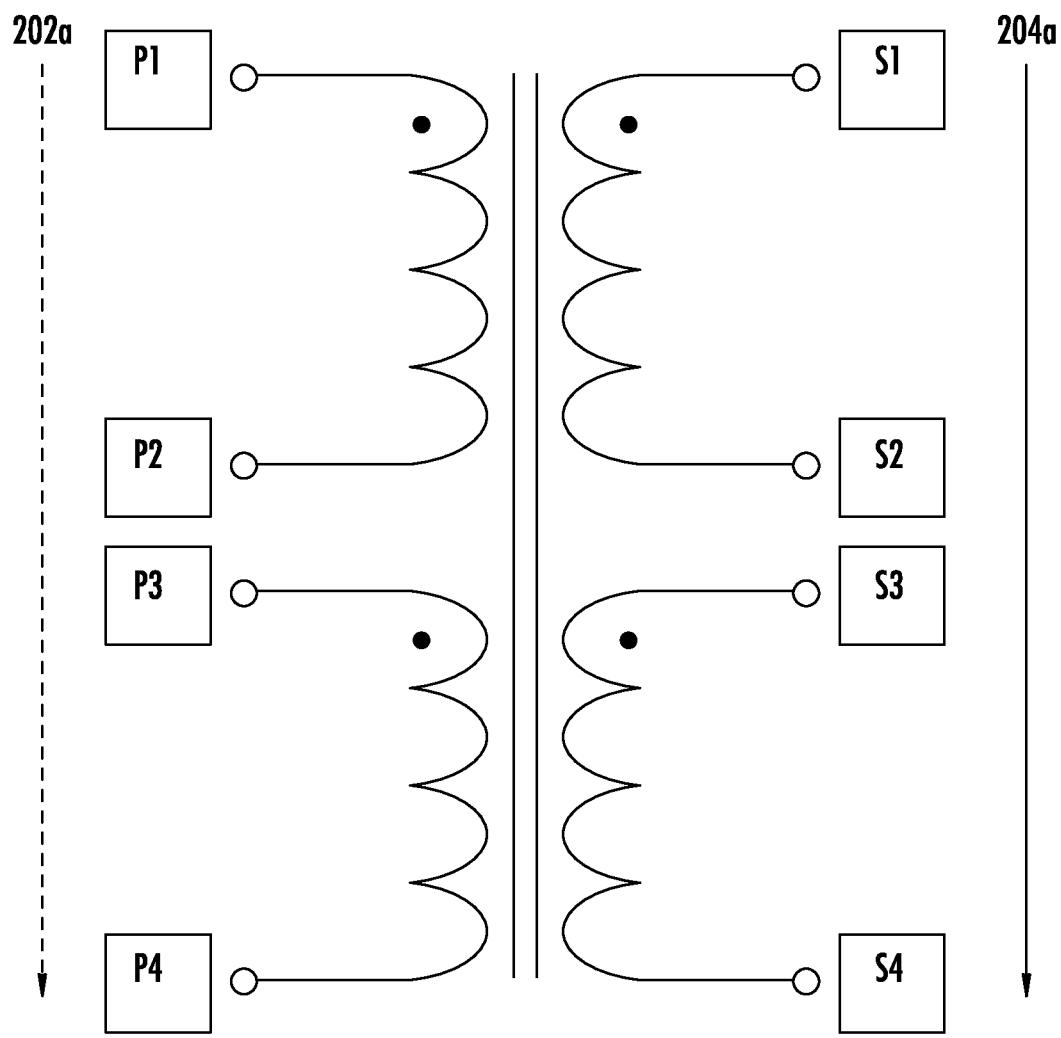
FIG. 2A is a schematic view illustrating a first exemplary method for winding the inductive device illustrated in FIGS. 1A-1E in accordance with the principles of the present disclosure.

Referring now to FIG. 2A, an exemplary winding schematic for use with the inductive device illustrated in, for example, FIG. 1C is shown and described in detail. The winding process utilizes in one embodiment standard/known automatic winding equipment that enables the high-speed winding of standard magnet wires (stranded, twisted, or the like) onto the I-shaped core, thereby reducing production costs associated with the manufacture of these inductive devices. The schematic illustrated in FIG. 2A includes two (2) sets of primary windings (i.e., P1-P2 and P3-P4) and two (2) sets of secondary windings (i.e., S1-S2 and S3-S4) along with eight (8) termination pads associated with the ends of each of these aforementioned windings. The automatic process for winding these primary/secondary windings is as follows.

First, the starting portions for the two (2) primary windings are first secured to termination pads P1 and P3, respectively.

Next, these two (2) primary windings are then wound onto the axial portion of the core using high-speed automated winding equipment (not shown). Dashed arrow 202a denotes the direction of winding along the axial portion of the core for the set of primary windings.

Subsequent to completing the winding of the primary windings onto the axial portion of the core, the end portions for the two (2) primary windings originating from termination pads P1 and P3 are then subsequently secured to termination pads P2 and P4, respectively.

Next, the starting portions for the two (2) secondary windings are then secured to termination pads S1 and S3, respectively. Advantageously, the primary windings and the secondary windings will be manufactured from the same spool of magnet wire thereby facilitating the speed and low-production time associated with such a winding process.

The two (2) secondary windings originating from termination pads S1 and S3 are then wound onto the axial portion of the core and subsequently terminated to termination pads S2 and S4, respectively. Solid arrow 204a denotes the direction of traversal along the axial portion of the core for the set of secondary windings to be wound around the axial portion. In such a configuration, the windings will be disposed on the core as shown in FIG. 1E.

Alternatively, and in a method that further reduces the production time associated with the windings of the I-shaped core, the primary windings will first be wound as described above. However, the secondary windings will first be secured to termination pads S2 and S4. The two (2) secondary windings originating from termination pads S2, S4 are then wound onto the axial portion of the core and in a direction substantially opposite to that shown by solid arrow 204a. Such an alternative arrangement has advantages in winding speed as the winding nozzle (not shown) will not have to traverse across the axial portion of the core subsequent to the winding of the primary windings and prior to the start of the winding for the secondary windings. Such an alternative arrangement can be considered a "one round trip" process, as the complete set of windings can be completed via two (2) traversals across the axial portion of the core (as opposed to the three (3) traversals described previously above).

Subsequent to the winding of the primary and secondary windings, an adhesive epoxy is then dispensed onto the top portion of the flanges (i.e., the non-plated surface of the flange disposed opposite the termination pads), and a magnetically permeable cap piece is placed onto the top portion of the flanges. The epoxy is then subsequently cured. Optionally, the wound inductive device is electrically tested prior to being packaged into, for example, a carrier tape using known packaging processes.

The aforementioned winding processes enable a high amount of magnetic/capacitive coupling between the turns of the windings, as each turn of the secondary winding is disposed on top of or otherwise proximate a respective turn of the primary winding, thereby extending the bandwidth for the underlying transformer. Moreover, as the inductive device includes four (4) independent windings (i.e., two (2) primary windings and two (2) secondary windings), termination pads P2 and P3 must be coupled together in order to form the center tap connection for the primary side of the transformer. Herein lies a salient advantage of the exemplary embodiments disclosed herein; namely, the aforementioned termination pads may be electrically coupled via a trace located on a printed circuit board (PCB) (not shown) onto which the inductive device is ultimately disposed. This trace effectively couples the two sets of windings and forms a center tap connection for the underlying transformer.

Similarly, termination pads S2 and S3 must be coupled together in order to form the center tap connection for the secondary side of the transformer. This coupling is advantageously accomplished via a trace located on the PCB as described above with respect to the primary windings.

Figure 2B:
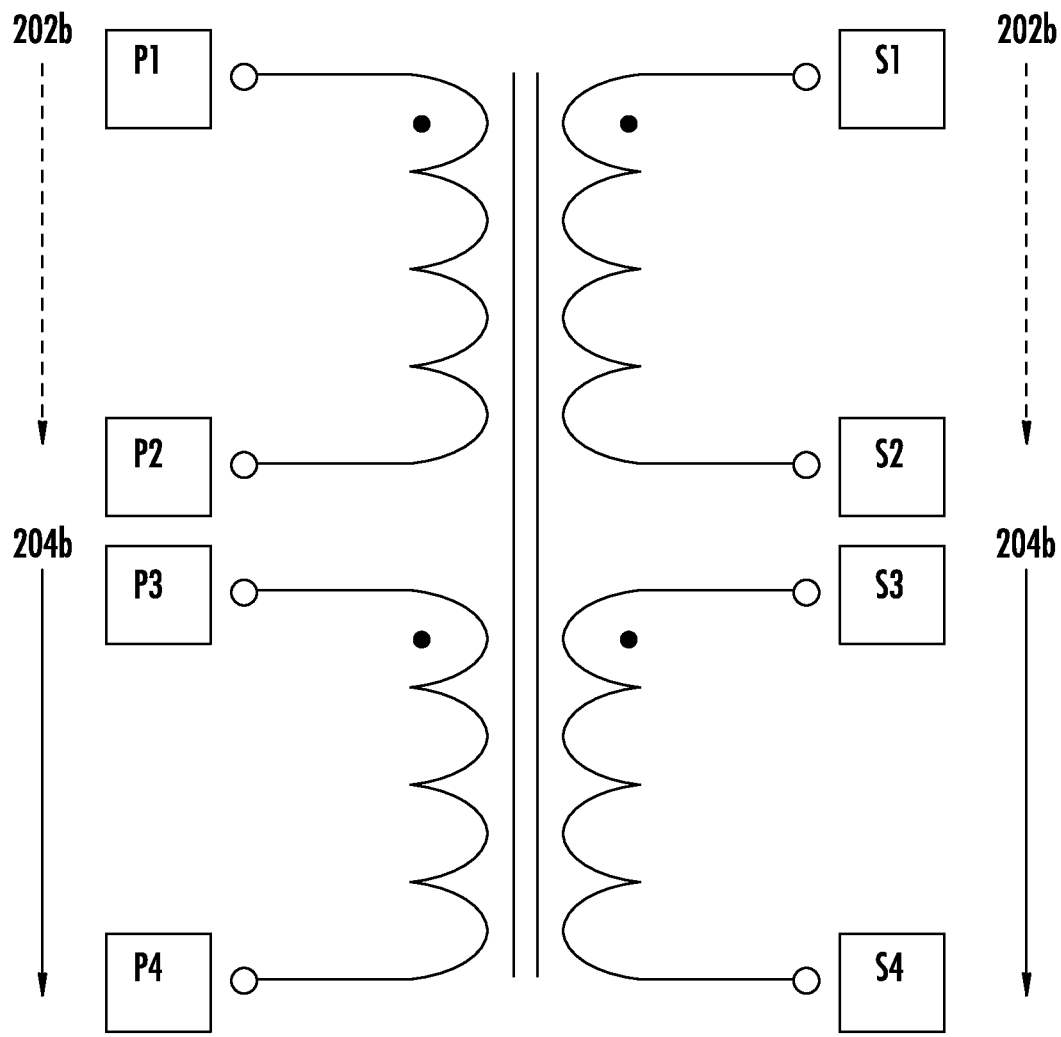
FIG. 2B is a schematic view illustrating a second exemplary method for winding the inductive device illustrated in FIGS. 1A-1E in accordance with the principles of the present disclosure.

Referring now to FIG. 2B, an alternative winding arrangement for use with the inductive device illustrated in, for example, FIG. 1C is shown and described in detail. Similar to the embodiment illustrated in FIG. 2A, the schematic again includes two (2) primary windings and two (2) secondary windings. The automated process for winding these windings is as follows. The starting portions for a first primary winding and a first secondary winding are first secured to termination pads P1 and S1, respectively. These two (2) windings are then wound onto the axial portion of the core using high-speed automated winding equipment. Dashed arrows 202b denote the direction of traversal along the axial portion of the core for the first set of windings to be wound around the axial portion. The end portions for the two (2) windings originating from termination pads P1 and S1 are then subsequently secured to termination pads P2 and S2, respectively.

Next, the starting portions for the second primary winding and second secondary winding are then secured to termination pads P3 and S3, respectively. The two (2) windings originating from termination pads P3 and S3 are then wound onto the axial portion of the core and subsequently terminated to termination pads P4 and S4, respectively. Solid arrows 204b denote the direction of traversal along the axial portion of the core for the second set of windings to be wound around the axial portion of the core and onto the first set of windings. Such a winding configuration may not have as good of electrical balance characteristics as the winding configuration shown in FIG. 2A, however, as the two portions of both the primary and secondary winding are wound on two different layers of the core.

An adhesive epoxy is then dispensed onto the top portion of the flanges (i.e., the surfaces of the flanges opposite the termination pads), and a magnetically permeable cap piece is placed onto the top portion of the flanges and the epoxy is subsequently cured. Optionally, and as described previously herein, the wound inductive device is tested prior to being packaged into, for example, a carrier tape.

Alternatively, the winding process similar to the "one round trip" process described above with regards to FIG. 2A may be utilized. Such an alternative arrangement reduces the production time associated with the windings of the I-shaped core as previously described above. First, the primary and secondary windings (i.e., P1-P2 and S1-S2) will first be wound as described above. However, the second set of windings (i.e., P3-P4 and S3-S4) will first be secured to termination pads P4 and S4. The two (2) windings originating from termination pads P4 and S4 are then wound onto the axial portion of the core and in a direction substantially opposite to that shown by solid arrow 204b. Such an alternative arrangement has advantages in, inter alia, winding speed as the winding nozzle (not shown) will not have to traverse across the axial portion of the core subsequent to the winding of the first set of windings and prior to the start of the winding for the second set of windings. Similar to the previous discussion above, such an arrangement can be considered a "one round trip" process as the complete set of windings can be completed via two traversals across the axial portion of the core (as opposed to the three traversals described previously above).

In yet other alternative variants to the specific configurations shown in FIGS. 2A and 2B, the center tap may be incorporated on one of either the primary or secondary winding. For example, in the embodiment illustrated in FIG. 2A, the center tap connections S2 and S3 may be obviated altogether resulting in a primary winding coupled from P1-P2 and P3-P4 while the secondary side will consist of a single winding that couples from S1-S4 (i.e., the center tap connections S2 and S3 are not utilized). In yet another alternative example, and again referring to FIG. 2A, the center tap connections P2 and P3 may be obviated resulting in a secondary winding coupled from S1-S2 and S3-S4 while the primary side will consist of a single winding that couples from P1-P4 (i.e., the center tap connections P2 and P3 are not utilized). These and other variants would be readily appreciated by one of ordinary skill given the contents of the present disclosure.

Methods of Use

The I-shaped core wound by the aforementioned exemplary winding processes may be used in a myriad of applications. In particular, ICM (e.g., connector) embodiments may utilize one or more of these inductive devices described in the present disclosure. Examples of ICMs that can be utilized in conjunction with the inductive devices described herein include, but are not limited to, those described in co-owned U.S. Pat. No. 6,062,908 entitled "High density connector modules having integral filtering components within repairable, replaceable submodules" issued May 16, 2000; co-owned U.S. Pat. No. 6,585,540 entitled "Shielded microelectronic connector assembly and method of manufacturing" issued Jul. 1, 2003; co-owned U.S. Pat. No. 6,962,511 entitled "Advanced microelectronic connector assembly and method of manufacturing" issued Nov. 8, 2005; and co-owned U.S. Pat. No. 7,241,181 entitled "Universal connector assembly and method of manufacturing" issued Jul. 10, 2007, the contents of each which are incorporated herein by reference in its entirety.

Figure 3A:
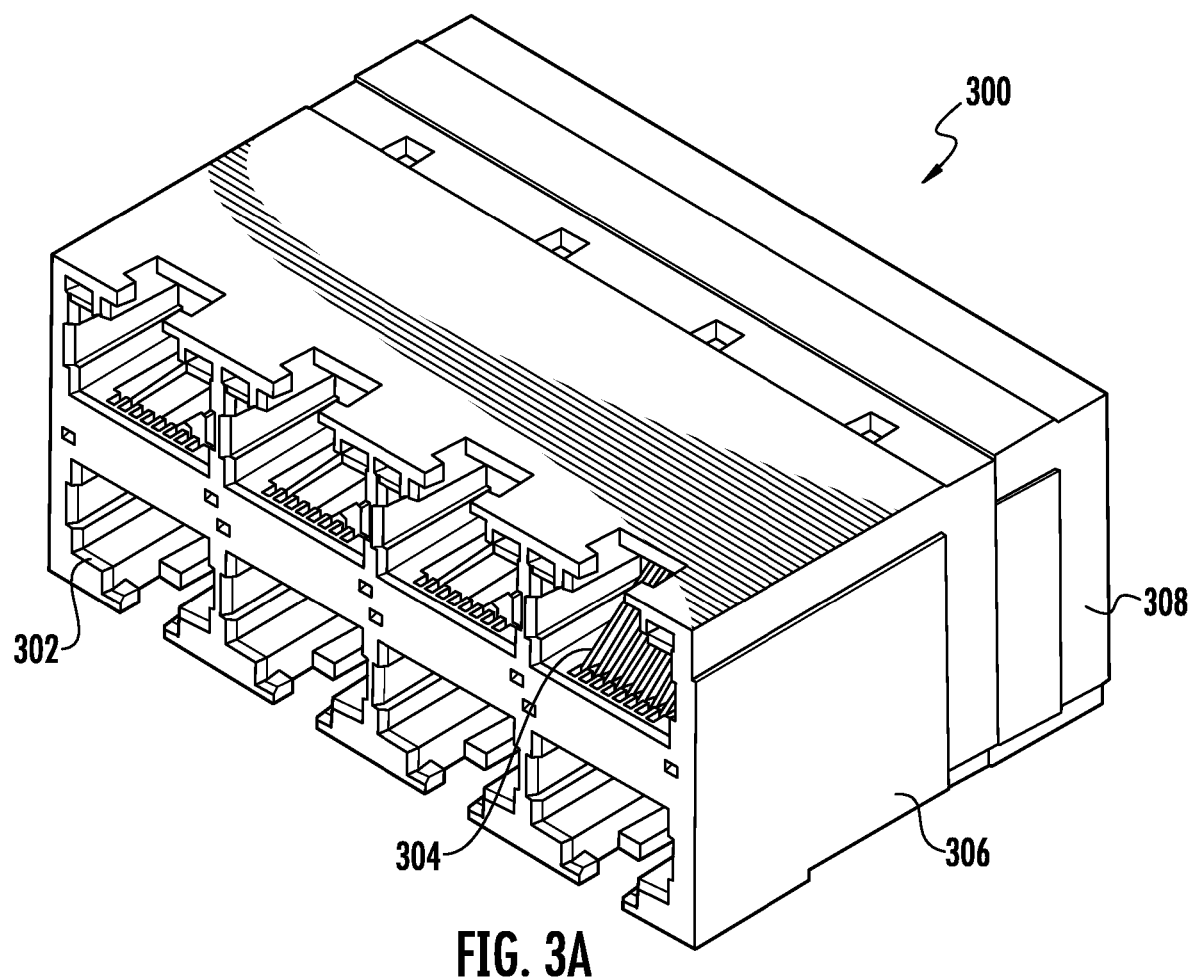
FIG. 3A is a perspective view of an exemplary embodiment of an integrated connector module (ICM) comprised of inductive device assemblies having the exemplary inductive device of FIG. 1C, in accordance with the principles of the present disclosure.
Figure 3B:
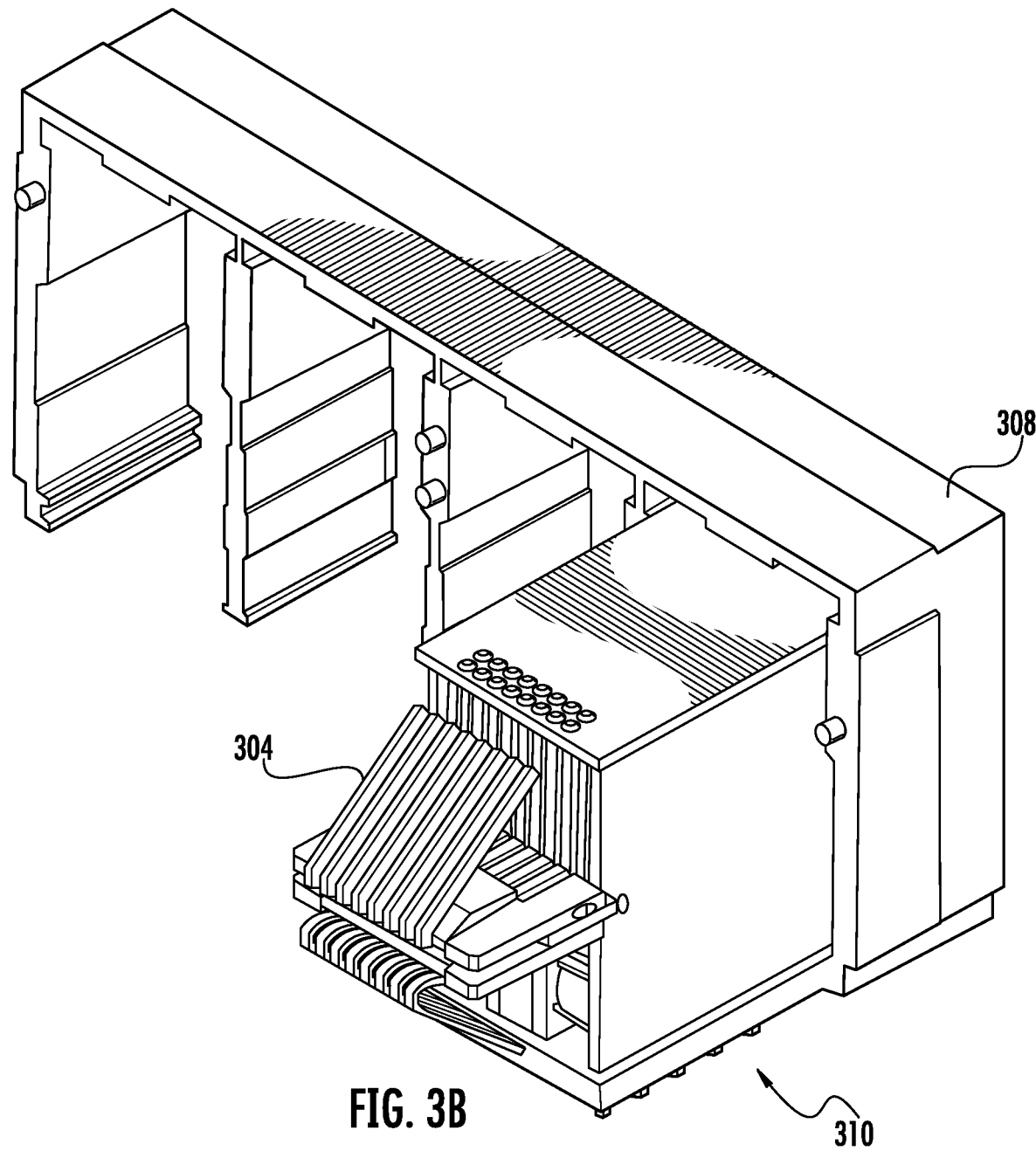
FIG. 3B is a perspective view of the ICM of FIG. 3A with the front housing and three (3) of the four (4) inductive device assemblies removed from view, in accordance with the principles of the present disclosure.

FIG. 3A illustrates one such exemplary multi-port ICM 300, comprising an array of ports 302 arranged in a two-by-four (2×4) fashion. Each of the ports 302 may have a set of conductors 304 that are adapted for connection to an inserted male plug (e.g., an RJ 45 type) of the type well known in the telecommunications connector arts. It will be appreciated that while an RJ 45 type application is illustrated, the connector module of the present disclosure is in no way so limited, or in any way limited to a particular type of electrical connector (e.g., it can be used with other connector/plug types or form factors, whether modular or otherwise). FIG. 3B illustrates the ICM 300 with the front housing 306 removed from view so that the back housing 308 and various features of the inductive device assembly 310 (in this case illustrating two vertically oriented substrates upon which the inductive devices 100 may be mounted) can be readily seen.

The inductive device assembly 310 may house a number of electronic components including magnetically permeable cores of various types. As previously mentioned, the I-shaped cores described herein and assembled in accordance with the principles of the present disclosure may be utilized in conjunction with, or in replacement of, other inductive-type devices. Specifically, the I-shaped cores may be positioned in an array (not shown) inside the assembly 310 in a geometric arrangement so as to achieve the desired end-application signal conditioning function. Depending on the dimensions of the assembly, or the cores, the number of cores utilized and the positioning thereof may vary. Other types of magnetically permeable cores well known in the prior art may also be used in combination with the inductive device of, for example, FIG. 1C. For example, components such as, inter alia, toroidal cores, stitched cores and non-toroidal cores, described in co-owned U.S. Pat. No. 8,591,262 filed Sep. 3, 2010 and entitled "Substrate Inductive Devices and Methods", the contents of which are incorporated herein by reference in its entirety, may be utilized.

It will be recognized that while certain aspects of the disclosure are described in terms of specific design examples, these descriptions are only illustrative of the broader methods, and may be modified as required by the particular design. Certain steps may be rendered unnecessary or optional under certain circumstances. Additionally, certain steps or functionality may be added to the disclosed embodiments, or the order of performance of two or more steps permuted. All such variations are considered to be encompassed within the disclosure and claims herein.

While the above detailed description has shown, described, and pointed out novel features of the disclosure as applied to various embodiments, it will be understood that various omissions, substitutions, and changes in the form and details of the device or process illustrated may be made by those skilled in the art. The foregoing description is of the best mode presently contemplated. This description is in no way meant to be limiting, but rather should be taken as illustrative of the general principles of the disclosure, the scope of which should be determined with reference to the claims.

What is claimed is:

1. An inductive device, comprising:
a core comprising an axial portion, a first flange portion, and a second flange portion, with the first flange portion being disposed on an opposing side of the axial portion with the second flange portion;
an end cap core portion, the end cap core portion being coupled with both the first flange portion and the second flange portion;
the first flange portion comprising a first plurality of interface connections, and the second flange portion comprising a second plurality of interface connections;
a pair of primary windings, with each primary winding of the pair being coupled to one of the first plurality of interface connections and one of the second plurality of interface connections; and
a pair of secondary windings, with each secondary winding of the pair being coupled to one of the first plurality of interface connections and one of the second plurality of interface connections;
wherein the pair of secondary windings are configured to be coupled to the second plurality of interface connections subsequent to the coupling of the pair of primary windings to the second plurality of interface connections and previous to the coupling of the pair of secondary windings to the first plurality of interface connections, so as to enable winding of the pair of primary windings in a first direction and the pair of secondary windings in a second direction within two traversals across the axial portion of the core;
wherein the pair of secondary windings are wound directly over the pair of primary windings;
wherein the coupling of the end cap core portion with both the first flange portion and the second flange portion is configured to provide a closed magnetic path for magnetic flux resultant from current running through the pair of primary and/or secondary windings; and
wherein the first plurality of interface connections comprises a first primary interface connection, a first primary center tap interface connection, a first secondary interface connection, and a first secondary center tap interface connection.

2. The inductive device of claim 1, wherein the second plurality of interface connections comprises a second primary interface connection, a second primary center tap interface connection, a second secondary interface connection, and a second secondary center tap interface connection.

3. The inductive device of claim 2, wherein the pair of primary windings comprises:
a first primary winding that couples the first primary interface connection to the second primary center tap interface connection; and
a second primary winding that couples the first primary center tap connection to the second primary interface connection.

4. The inductive device of claim 3, wherein the pair of secondary windings comprises:
a first secondary winding that couples the first secondary interface connection to the second secondary center tap interface connection; and
a second secondary winding that couples the first secondary center tap connection to the second secondary interface connection.

5. The inductive device of claim 4, wherein the pair of primary windings and the pair of secondary windings are disposed about the axial portion of the core in a plurality of layers.

6. The inductive device of claim 5, wherein the pair of primary windings are disposed in a layer proximate to the axial portion of the core and the pair of secondary windings are disposed in a second layer of the plurality of layers, the layer proximate to the axial portion residing between the axial portion of the core and the second layer of the plurality of layers.

7. The inductive device of claim 5, wherein the pair of secondary windings are disposed in a layer proximate to the axial portion of the core and the pair of primary windings are disposed in a second layer of the plurality of layers, the layer proximate to the axial portion residing between the axial portion of the core and the second layer of the plurality of layers.

8. The inductive device of claim 5, wherein the first primary winding is disposed in a layer proximate to the axial portion of the core and the second primary winding is disposed in a second layer of the plurality of layers, the layer proximate to the axial portion residing between the axial portion of the core and the second layer of the plurality of layers.

9. The inductive device of claim 8, wherein the first secondary winding is disposed in the layer proximate to the axial portion of the core and the second secondary winding is disposed in the second layer of the plurality of layers.

10. The inductive device of claim 5, wherein the pairs of primary and secondary windings are disposed upon the axial portion of the core so as to enhance magnetic and capacitive coupling between the windings.

11. The inductive device of claim 1, wherein the pair of primary windings is wound from the first flange portion to the second flange portion, and the pair of secondary windings is wound from the second flange portion to the first flange portion.

12. The inductive device of claim 2, wherein the first primary center tap interface connection and the second primary center tap interface connection are electrically coupled to form a primary center tap connection.

13. The inductive device of claim 1, wherein one of the pair of primary windings and one of the pair of secondary windings are disposed on a layer proximate to the axial portion of the core; and
wherein another one of the pair of primary windings and another one of the pair of secondary windings are disposed on a second layer wound onto the layer proximate to the axial portion of the core.

14. An electronics subassembly, comprising:
a printed circuit board; and
an inductive device, the inductive device comprising:
a core comprising an axial portion, a first flange portion, and a second flange portion, with the first flange portion being disposed on an opposing side of the axial portion with the second flange portion;
the first flange portion comprising a first plurality of interface connections, and the second flange portion comprising a second plurality of interface connections;
a pair of primary windings, with each primary winding of the pair being coupled to one of the first plurality of interface connections and one of the second plurality of interface connections; and
a pair of secondary windings, with each secondary winding of the pair being coupled to one of the first plurality of interface connections and one of the second plurality of interface connections;
wherein the coupling of the pair of secondary windings to the second plurality of interface connections is secured subsequent to a winding of the pair of primary windings across the axial portion in a first direction and the coupling of the pair of primary windings to the second plurality of interface connections, the coupling of the pair of secondary windings to the first plurality of interface connections being secured subsequent to a winding of the pair of secondary windings across the axial portion in a second direction;

wherein the pair of secondary windings are wound directly over the pair of primary windings such that a given wire of the pair of secondary windings is disposed directly over a corresponding wire of the pair of primary windings with no offset relative thereto;

wherein the first plurality of interface connections comprises a first center tap connection, and the second plurality of interface connections comprises a second center tap connection;

wherein the printed circuit board comprises a first trace that runs between the first center tap connection and the second center tap connection;

wherein the first plurality of interface connections comprises a third center tap connection and the second plurality of interface connections comprises a fourth center tap connection;

wherein the printed circuit board comprises a second trace that runs between the third center tap connection and the fourth center tap connection; and wherein the first and second center tap connections are for a primary winding of a transformer and the third and fourth center tap connections are for a secondary winding of the transformer.

15. An inductive device, comprising:

a core comprising an axial portion, a first flange portion, and a second flange portion, the first flange portion being disposed on an opposing side of the axial portion from the second flange portion;

a pair of primary windings that are configured to be electrically coupled to each other via a primary winding center tap connection, each of the pair of primary windings being further coupled to the first flange portion and the second flange portion; and a pair of secondary windings that are configured to be electrically coupled to each other via a secondary winding center tap connection, each of the pair of secondary windings being further coupled to the first flange portion and the second flange portion;

wherein the pair of primary windings are wound around the axial portion of the core from the first flange portion to the second flange portion in a first direction; and wherein, subsequent to the winding of the pair of primary windings in the first direction, the pair of secondary windings are wound over the pair of primary windings from the second flange portion to the first flange portion in a second direction that is substantially opposite to the first direction and without an offset between the pair of secondary windings and the pair of primary windings.

16. The inductive device of claim 15, wherein:

a first portion of the primary winding center tap connection is disposed on the first flange portion and a second portion of the primary winding center tap connection is disposed on the second flange portion; and a first portion of the secondary winding center tap connection is disposed on the first flange portion and a second portion of the secondary winding center tap connection is disposed on the second flange portion.

* * * * *